(12) United States Patent
Ooue et al.

(10) Patent No.: US 11,147,173 B2
(45) Date of Patent: Oct. 12, 2021

(54) ELECTRONIC DEVICE

(71) Applicant: DIAMOND ELECTRIC MFG. CO., LTD., Osaka (JP)

(72) Inventors: Tatsuya Ooue, Osaka (JP); Hiroki Nakata, Osaka (JP)

(73) Assignee: DIAMOND ELECTRIC MFG. CO., LTD., Osaka (JP)

( * ) Notice: Subject to any disclaimer, the term of this patent is extended or adjusted under 35 U.S.C. 154(b) by 0 days.

(21) Appl. No.: 16/834,212

(22) Filed: Mar. 30, 2020

(65) Prior Publication Data

US 2020/0367372 A1 Nov. 19, 2020

(30) Foreign Application Priority Data

May 14, 2019 (JP) .............................. JP2019-091563

(51) Int. Cl.
*H05K 5/00* (2006.01)
*H01R 13/50* (2006.01)
*H01R 13/52* (2006.01)

(52) U.S. Cl.
CPC ........... *H05K 5/0069* (2013.01); *H01R 13/50* (2013.01); *H01R 13/5202* (2013.01); *H05K 5/0052* (2013.01); *H05K 5/0056* (2013.01)

(58) Field of Classification Search
CPC .. H01R 13/50; H01R 13/5202; H05K 5/0069; H05K 5/0052; H05K 5/0056
USPC ....................................................... 439/76.1
See application file for complete search history.

(56) References Cited

U.S. PATENT DOCUMENTS

| | | | | |
|---|---|---|---|---|
| 7,578,681 B2* | 8/2009 | Honda | ............... | H01R 43/0256 439/83 |
| 8,770,989 B2* | 7/2014 | Ohhashi | ............... | H05K 5/0069 439/76.1 |
| 8,942,001 B2* | 1/2015 | Kawai | .................. | H05K 5/0052 361/752 |
| 9,197,002 B2* | 11/2015 | Satoh | .................... | H01R 13/516 |
| 9,281,607 B2* | 3/2016 | Lee | ........................ | H05K 5/062 |
| 9,775,256 B2* | 9/2017 | Garcia | ................. | H05K 5/0052 |
| 9,814,147 B2* | 11/2017 | Igari | ..................... | H05K 5/0069 |
| 9,949,394 B2* | 4/2018 | Kamoshida | .......... | H05K 5/0026 |
| 10,630,150 B2* | 4/2020 | Tsuboi | ..................... | B25J 9/126 |
| 2009/0068862 A1* | 3/2009 | Honda | .................. | H05K 5/0052 439/78 |
| 2011/0211311 A1* | 9/2011 | Shinoda | ............... | H05K 5/0213 361/694 |

(Continued)

FOREIGN PATENT DOCUMENTS

JP 2009-70855 A 4/2009
JP 2018-74097 A 5/2018

*Primary Examiner* — Alexander Gilman
(74) *Attorney, Agent, or Firm* — Birch, Stewart, Kolasch & Birch LLP

(57) ABSTRACT

An electronic device includes a housing, a circuit substrate, a connector, and a seal obtained by a sealant having fluidity being hardened. The housing includes a lower case and an upper case that covers the lower case. The connector is disposed between the upper case and the lower case. The lower case has a case groove. A connector projection disposed on the connector and a case projection disposed on the upper case are fitted into the case groove. The connector includes a connector groove, and the case projection is fitted into the connector groove. An obstructor for inhibiting flow of the sealant is disposed in the case groove or the connector groove.

12 Claims, 10 Drawing Sheets

(56) References Cited

U.S. PATENT DOCUMENTS

| | | | | |
|---|---|---|---|---|
| 2012/0069532 A1* | 3/2012 | Azumi | ............... | H05K 7/20854 |
| | | | | 361/752 |
| 2012/0127677 A1* | 5/2012 | Wakana | ............... | H05K 5/0069 |
| | | | | 361/752 |
| 2012/0320544 A1* | 12/2012 | Ohhashi | ................ | H05K 5/062 |
| | | | | 361/752 |
| 2013/0069320 A1* | 3/2013 | Yanagisawa | ......... | H05K 5/0056 |
| | | | | 277/628 |
| 2013/0120943 A1* | 5/2013 | Tamura | ................. | H05K 5/069 |
| | | | | 361/752 |
| 2013/0271933 A1* | 10/2013 | Tanaka | ................ | H05K 5/0052 |
| | | | | 361/752 |
| 2014/0080329 A1* | 3/2014 | Yamanaka | ......... | H01R 13/5202 |
| | | | | 439/76.1 |
| 2016/0165736 A1* | 6/2016 | Tsuboi | .................. | H02K 11/33 |
| | | | | 310/71 |

* cited by examiner

ELECTRONIC DEVICE

This application claims priority on Patent Application No. 2019-091563 filed in JAPAN on May 14, 2019. The entire contents of this Japanese Patent Application are hereby incorporated by reference.

BACKGROUND OF THE INVENTION

Field of the Invention

The present invention relates to electronic devices.

Description of the Related Art

In recent years, an idling stop function has become widespread, and this requires electrical components such as an air-conditioner, an audio device, and a car navigation system to stably operate in an automobile also when an engine stops. Influence on a display screen and the like due to voltage drop in restart of an engine is also required to be reduced. An automobile has an electronic device for a power supply such as a DC-DC converter and a DC-AC inverter which steps down a voltage of a high-voltage battery such as a lithium ion battery in order to stably supply electricity also when an engine stops or restarts. Furthermore, the automobile also has an electronic device for control of the engine.

An automobile may run in bad weather, or on a rough road having puddles of water. A housing of an electronic device mounted to the automobile is required to be highly waterproof in order to protect circuit components in the automobile from water.

JP2009-70855 reports an electronic device which has improved sealability with respect to water. In the electronic device, the housing is formed by a box-shaped case having its upper surface opened and a box-shaped case having its lower surface opened being overlaid on each other. At a joining portion at which the cases are joined, a projection is disposed on a contact surface of one of the cases, and a groove is disposed in a contact surface of the other of the cases. The groove is filled with a sealant and the projection is then fitted into the groove, whereby sealing can be achieved at the joining portion.

The sealant has fluidity. Therefore, the sealant filled in the groove in the contact surface of the case may flow in the groove. When the sealant flows, the sealant may become insufficient in some portions of the groove. This may degrade sealability for the housing. An electronic device that allows achievement of high sealability is required.

An object of the present invention is to provide an electronic device that allows achievement of high sealability with respect to water.

SUMMARY OF THE INVENTION

An electronic device of the present invention includes: a box-shaped housing; a circuit substrate housed in the housing; a connector that is mounted to the circuit substrate and that has a portion exposed to outside of the housing; and a seal obtained by a sealant having fluidity being hardened. The housing includes a lower case and an upper case that covers the lower case. The connector is disposed between the upper case and the lower case. The lower case has, in a surface on the upper case side of the lower case, a case groove that extends along a peripheral edge portion of the surface. The upper case has, on a surface on the lower case side of the upper case, a case projection that extends along a peripheral edge portion of the surface. The connector has a connector groove in a surface on the upper case side, and has a connector projection on a surface on the lower case side. The connector projection is fitted into the case groove and the case projection is fitted into the connector groove at a position at which the connector is disposed between the upper case and the lower case. The case projection is fitted into the case groove at a position at which the connector is not disposed between the upper case and the lower case. The seal is filled in a gap between the case groove and each of the case projection and the connector projection, and in a gap between the connector groove and the case projection. An obstructor for inhibiting flow of the sealant is disposed in the case groove or the connector groove.

In the electronic device according to the present invention, the lower case has the case groove, and the connector projection disposed on the connector and the case projection disposed on the upper case are fitted into the case groove. The connector includes the connector groove, and the case projection is fitted into connector groove. The obstructor for inhibiting flow of the sealant is disposed in the case groove or the connector groove. The obstructor inhibits the flow of the sealant, whereby the sealant is prevented from becoming insufficient in some portions of the grooves. In the electronic device, high sealability is achieved.

The obstructor is preferably a projection disposed on a side wall of the case groove or the connector groove.

When the case groove or the connector groove has a tilted portion that is tilted relative to a horizontal direction, the projection is preferably disposed in the tilted portion.

In the case groove or the connector groove, a proportion of a width of the groove in a portion where the projection is disposed, to a width of the groove in a portion where the projection is not disposed, is preferably not less than 60% and preferably not greater than 95%.

In the case groove or the connector groove, a plurality of the projections are preferably aligned in a direction in which the groove extends, and a proportion of a width of the projection to a distance between the adjacent projections is preferably not less than 5% and preferably not greater than 25%.

The obstructor may be a stepped portion disposed at a bottom of the case groove or the connector groove.

A depth of a portion, of the case groove, into which the connector projection is fitted is preferably made greater than a depth of a portion, of the case groove, into which the case projection is fitted, to form the stepped portion.

A height of the stepped portion is preferably not less than 2 mm.

An electronic device of the present invention includes: a box-shaped housing; a circuit substrate housed in the housing; a connector that is mounted to the circuit substrate and that has a portion exposed to outside of the housing; and a seal obtained by a sealant having fluidity being hardened. The housing includes a lower case and an upper case that covers the lower case. The connector is disposed between the upper case and the lower case. The lower case has, in a surface on the upper case side of the lower case, a case groove that extends along a peripheral edge portion of the surface. The upper case has, on a surface on the lower case side of the upper case, a case projection that extends along a peripheral edge portion of the surface. The connector has a connector groove in a surface on the upper case side, and has a connector projection on a surface on the lower case side. The connector projection is fitted into the case groove and the case projection is fitted into the connector groove at a position at which the connector is disposed between the upper case and the lower case. The case projection is fitted into the case groove at a position at which the connector is not disposed between the upper case and the lower case. The seal is filled in a gap between the case groove, and each of the case projection and the connector projection and in a gap between the connector groove and the case projection. The case groove includes a liquid storage portion having a greater width than other portions, at a boundary between a portion, of the case groove, into which the case projection is fitted and a portion, of the case groove, into which the connector projection is fitted.

DESCRIPTION OF THE PREFERRED EMBODIMENTS

The following will describe in detail the present invention based on preferred embodiments with reference where appropriate to the accompanying drawing.

Figure 1:
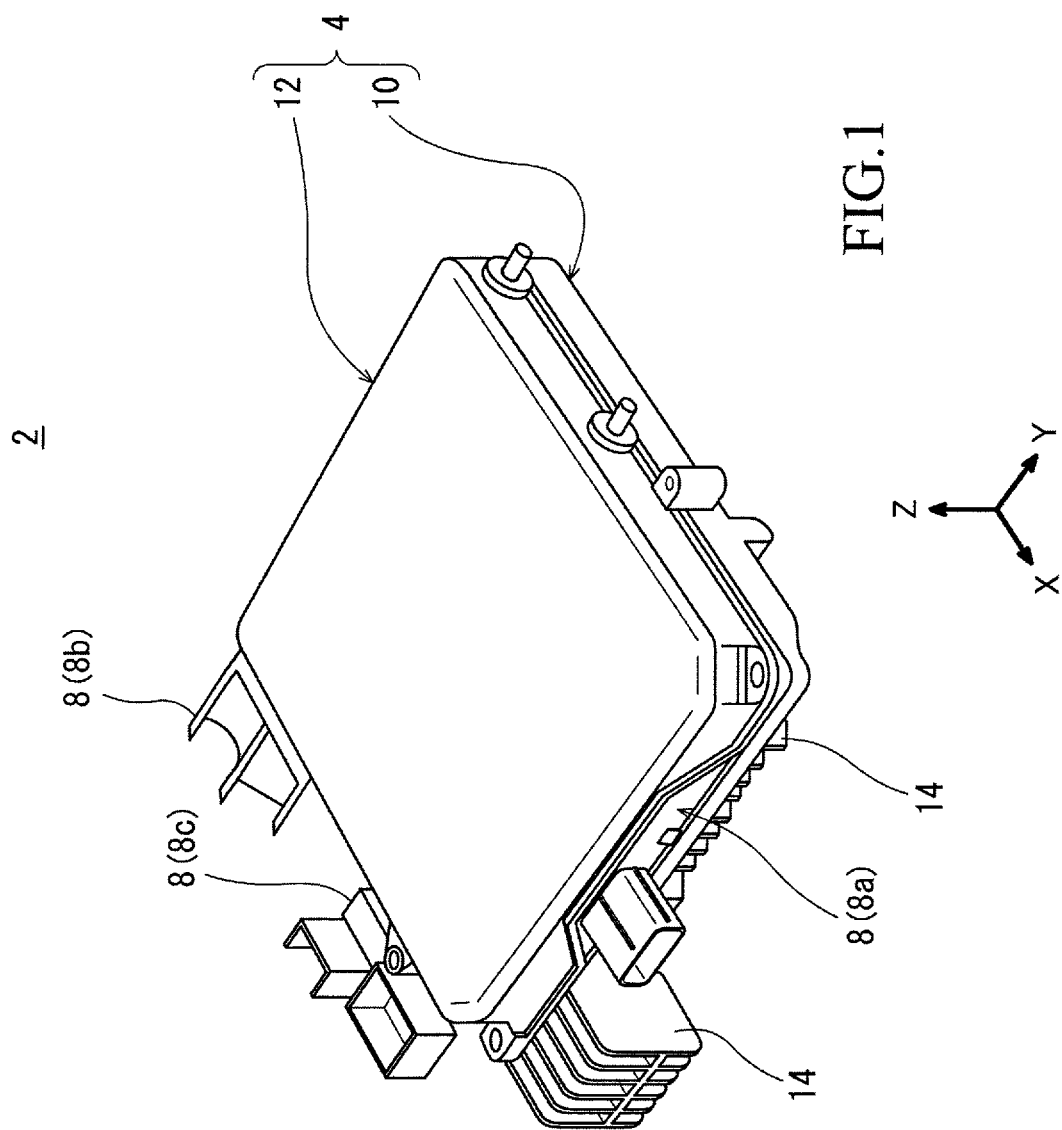
FIG. 1 is a perspective view of an electronic device according to one embodiment of the present invention.
Figure 2:
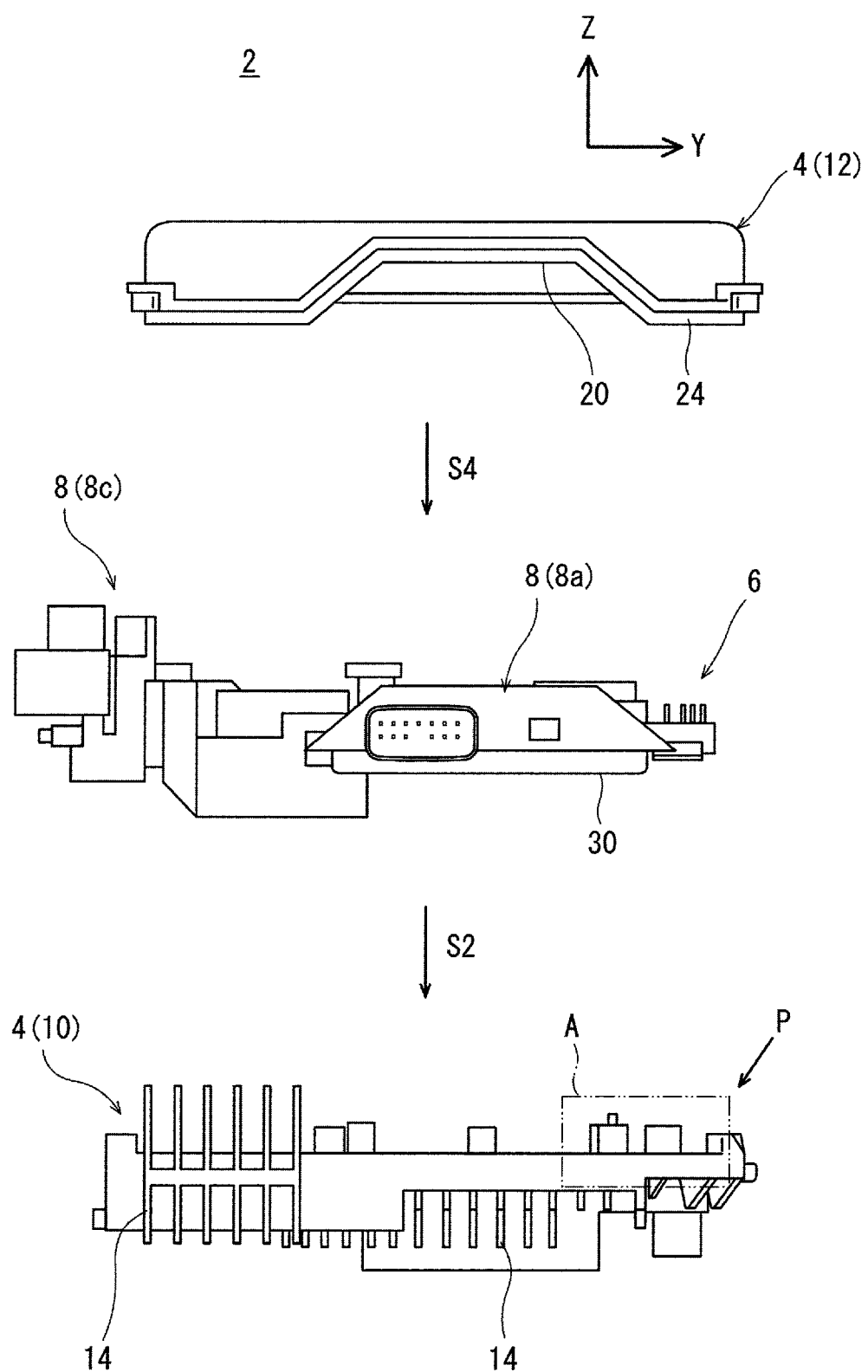
FIG. 2 is an exploded view of the electronic device shown in FIG. 1.

FIG. 1 shows an electronic device 2 according to one embodiment of the present invention. The electronic device 2 is a DC-DC converter to be mounted to an automobile. In the description herein, the direction indicated by an arrow X in FIG. 1 represents the front direction of the electronic device 2 and the opposite direction represents the rear direction thereof. The direction indicated by an arrow Y represents the rightward direction and the opposite direction represents the leftward direction. The direction indicated by an arrow Z represents the upward direction and the opposite direction represents the downward direction. Also in FIG. 2, the arrows Y and Z represent the same directions as in FIG. 1. FIG. 2 is an exploded view of the electronic device 2 shown in FIG. 1. The electronic device 2 includes a housing 4, a circuit substrate 6, and a connector 8.

The housing 4 is box-shaped. The housing 4 has an internal space in which the circuit substrate 6 is housed. The housing 4 is made of a metal having high thermal and electrical conductivities. The housing 4 contributes to heat dissipation and shielding from electromagnetic noise. The housing 4 may be made of an insulating material which has a low thermal conductivity. For example, the housing 4 may be made of a resin. The housing 4 made of a resin contributes to reduction of cost of the electronic device 2. The housing 4 includes a lower case 10 and an upper case 12.

Figure 3:
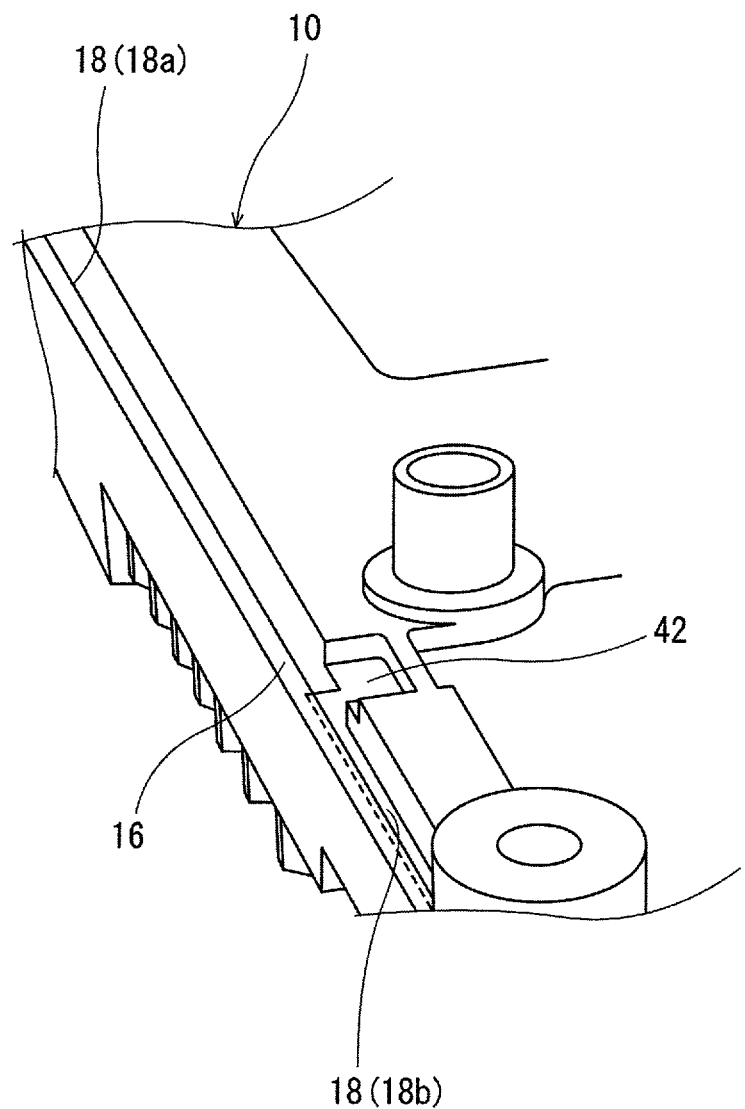
FIG. 3 is a perspective view of a part of a lower case shown in FIG. 2.

The lower case 10 has a box-like shape having its upper surface opened. As shown in FIGS. 1 and 2, the lower case 10 has a heat sink 14 for dissipating heat in the housing 4. The surface (upper surface), on the upper case 12 side, of the lower case 10 contacts with the upper case 12. This surface is called a contact surface. FIG. 3 is a perspective view of a portion, of the lower case 10, indicated by reference character A in FIG. 2, as viewed from the direction indicated by an arrow P. As shown in FIG. 3, a contact surface 16 of the lower case 10 has a case groove 18 that extends along the peripheral edge portion of the contact surface 16. The case groove 18 extends continuously along the peripheral edge portion of the contact surface 16.

Figure 4:
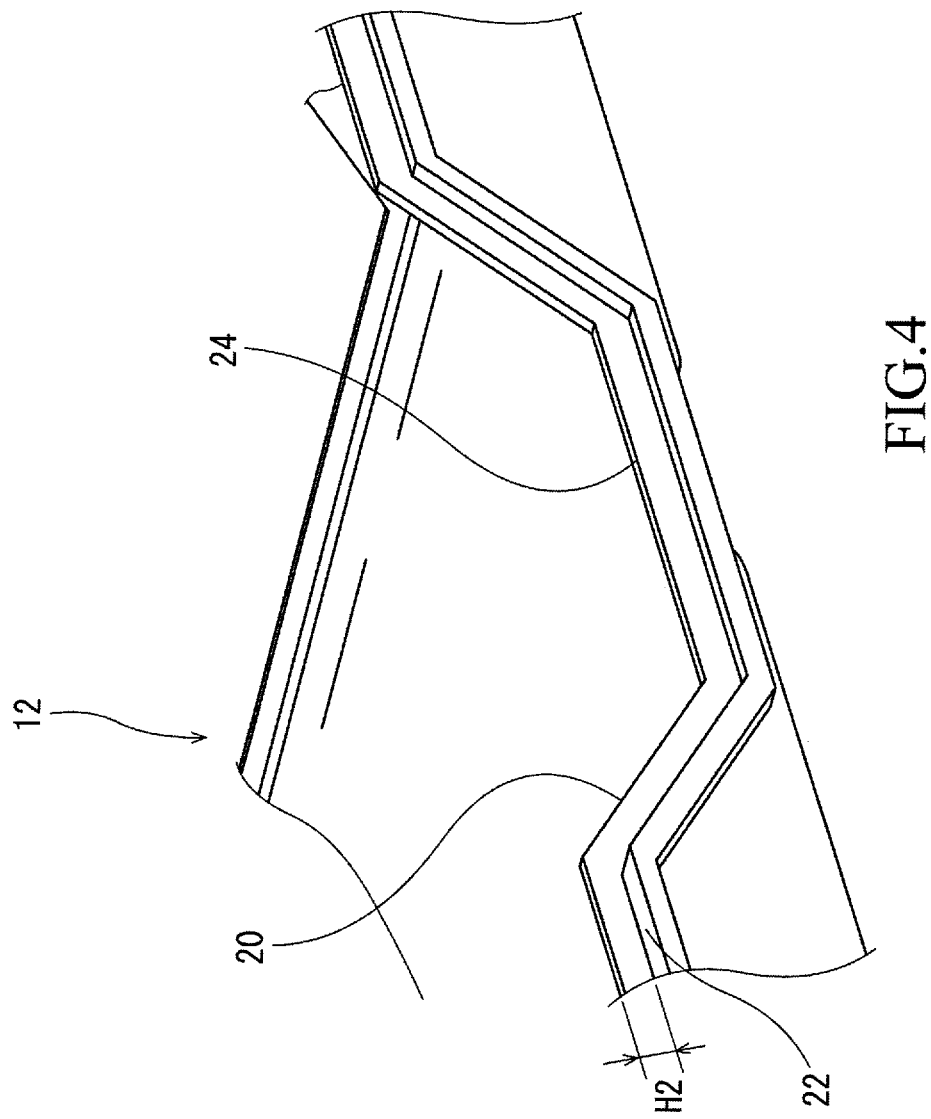
FIG. 4 is a perspective view of a part of an upper case shown in FIG. 2.

The upper case 12 has a box-like shape having its lower surface opened. The upper case 12 covers the lower case 10. As shown in FIG. 2, the upper case 12 has a trapezoidal recess 20 on the lower edge side on the front surface. FIG. 4 shows the recess 20 portion in an enlarged manner. FIG. 4 is a perspective view of the upper case 12 as viewed from therebelow. The surface (lower surface), on the lower case 10 side, of the upper case 12 contacts with the lower case 10. This surface is called a contact surface 22. As shown in FIGS. 2 and 4, the contact surface 22 of the upper case 12 has a case projection 24 that extends along the peripheral edge portion of the contact surface 22. The case projection 24 extends continuously along the peripheral edge portion of the contact surface 22.

The circuit substrate 6 is housed in an internal space of the housing 4. To the circuit substrate 6, a plurality of circuit components such as a transistor, a capacitor, and a transformer are mounted. In the present embodiment, the DC-DC converter circuit is configured by the circuit components. To the circuit substrate 6, the connector 8 is also mounted.

The connector 8 is mounted to the circuit substrate 6 and a part of the connector 8 is exposed to the outside of the housing 4. The connector 8 electrically connects the circuit in the housing 4 to the outside. As shown in FIG. 1, in the present embodiment, the electronic device 2 includes three connectors 8 that are a signal connector 8a, a bus bar connector 8b, and a capacitor connector 8c.

Figure 5:
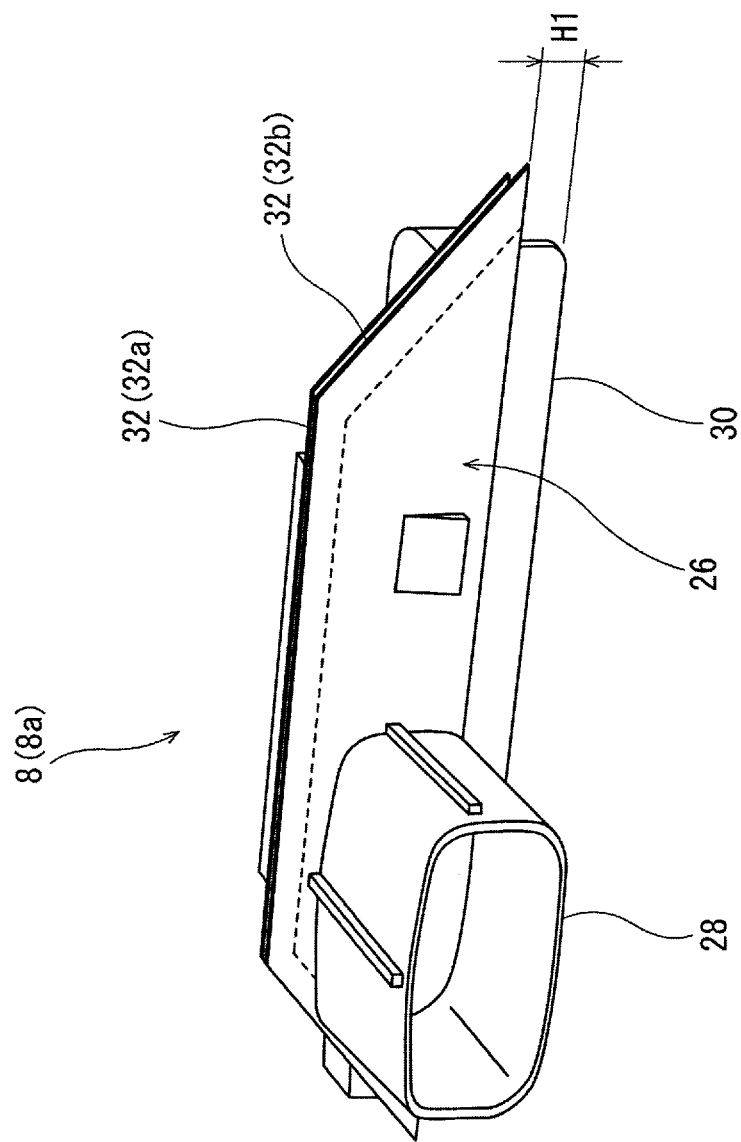
FIG. 5 is a perspective view of a connector shown in FIG. 2.

The signal connector 8a is disposed on the front surface side of the housing 4. FIG. 5 is a perspective view of the signal connector 8a. The signal connector 8a includes a center portion 26, a tubular portion 28, and an internal connection portion which is hidden by the center portion 26 in FIG. 5. The center portion 26 has a trapezoidal shape as viewed from the front thereof. The internal connection portion is disposed inside the housing 4. The tubular portion 28 projects forward from the center portion 26. The tubular portion 28 has a tubular shape. A plurality of connector terminals, which are not shown, are disposed in the tubular portion 28. The connector terminals are electrically connected to the circuit components of the circuit substrate 6 via the internal connection portion.

As shown in FIG. 5, the surface (the surface corresponding to the lower base of the trapezoid), on the lower case 10 side, of the center portion 26 has a connector projection 30 that extends along the peripheral edge portion of the surface. The surface (surface corresponding to the two legs and the upper base of the trapezoid), on the upper case 12 side, of the center portion 26 has a connector groove 32 that extends along the peripheral edge portion of the surface. In FIG. 5, the position of the bottom of the connector groove 32 is indicated by a broken line. In other words, the connector groove 32 includes a horizontal portion 32a that horizontally extends, and a pair of tilted portions 32b that are tilted relative to the horizontal direction. The paired tilted portions 32b each extend from a corresponding one of the ends of the horizontal portion 32a.

Figure 6:
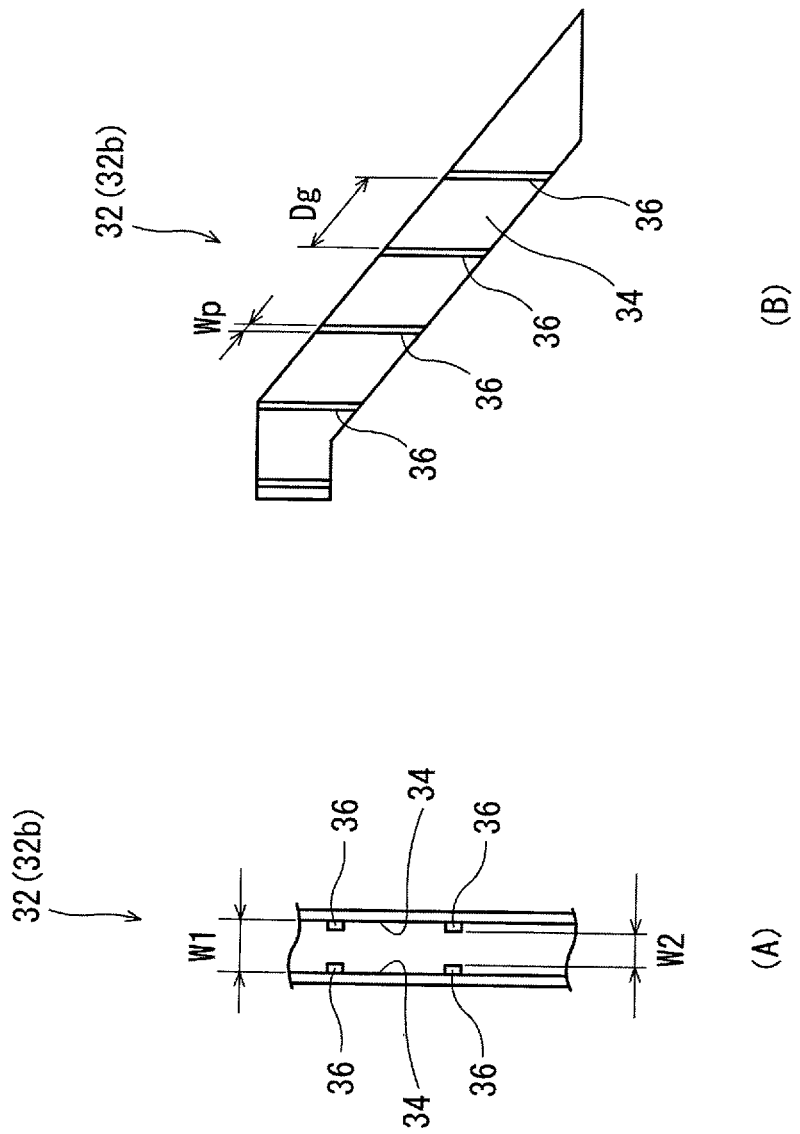
FIG. 6(A) is a plan view of a groove of the connector shown in FIG. 5.
FIG. 6(B) is a front view of a side wall of the groove.
Figure 6:
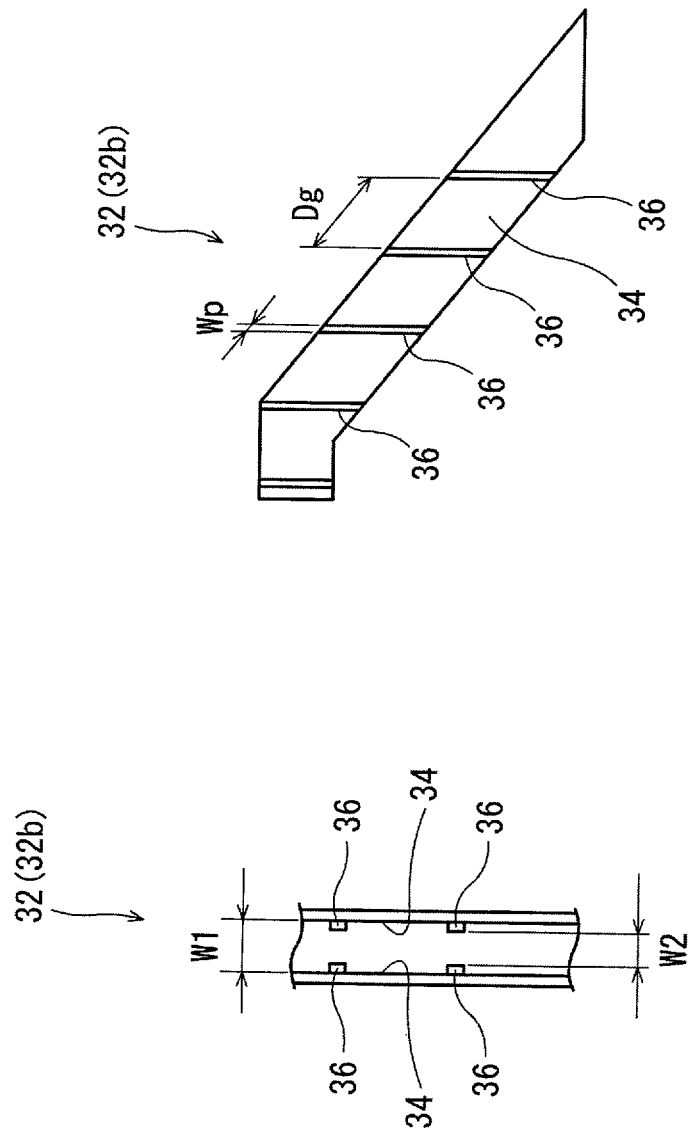

FIG. 6(A) shows the tilted portion 32b of the connector groove 32 as viewed from thereabove. FIG. 6(A) is a plan view of the tilted portion 32b of the connector groove 32. FIG. 6(B) shows one of the side wall 34 of the tilted portions 32b as viewed from the front side. As shown in FIGS. 6(A) and 6(B), groove projections 36 are disposed on the side wall 34 of the connector groove 32. In the present embodiment, the groove projections 36 are disposed on both the side walls 34 of the connector groove 32. As shown in FIG. 6(B), a plurality of the groove projections 36 are aligned in the direction in which the groove extends. Each of the groove projections 36 extends in the up-down direction. In the present embodiment, each projection 36 extends from the upper end of the side wall 34 of the connector groove 32 to the lower end thereof.

In the embodiment shown in FIG. 6(A), the positions of the groove projections 36 that are aligned on one of the side walls 34 of the connector groove 32 are the same as the positions of the groove projections 36 that are aligned on the other of the side walls 34 in the direction in which the connector groove 32 extends. These positions may be shifted from each other. For example, the groove projections 36 on one of the side walls 34 of the connector groove 32 and the groove projections 36 on the other of the side walls 34 thereof may be alternately aligned.

In the embodiment shown in FIG. 6(A), the groove projections 36 are aligned on both the side walls 34 of the connector groove 32. The groove projections 36 may be aligned on only one of the side walls 34.

As shown in FIG. 1, the center portion 26 of the signal connector 8a is fitted into the recess 20 of the upper case 12. The center portion 26 of the signal connector 8a is disposed between the lower case 10 and the upper case 12. At this time, the connector projection 30 is fitted into the case groove 18 at a position at which the signal connector 8a is disposed between the lower case 10 and the upper case 12. At this position, the case projection 24 is fitted into the connector groove 32. Furthermore, at a position at which the connector 8 is not disposed between the lower case 10 and the upper case 12, the case projection 24 is fitted into the case groove 18.

Figure 7:
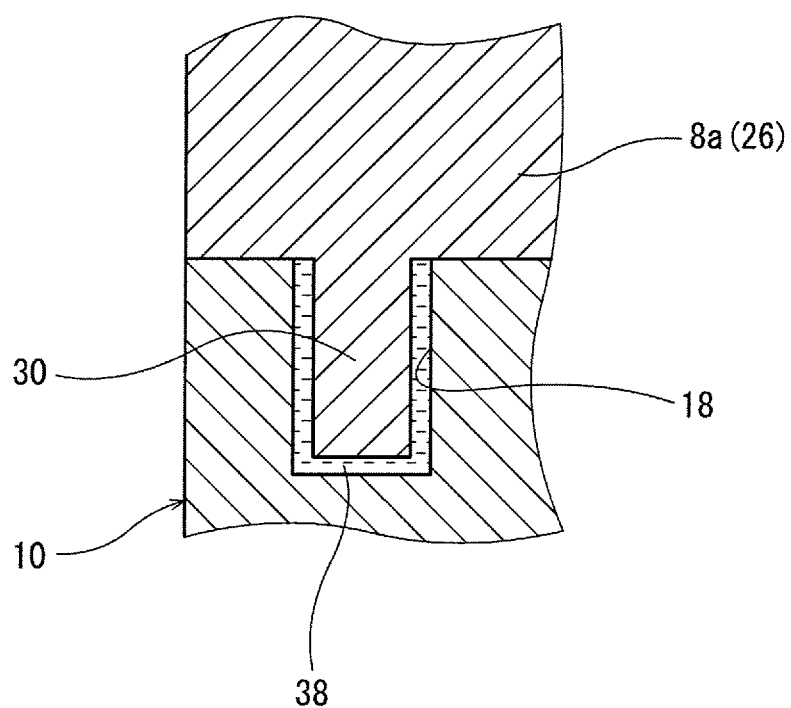
FIG. 7 is a cross-sectional view showing a state where a projection of the connector is fitted into a groove of the lower case.

FIG. 7 is a cross-sectional view showing a state where the connector projection 30 is fitted into the case groove 18. FIG. 7 shows a cross-section perpendicular to the direction in which the case groove 18 extends. As shown in FIG. 7, a seal 38 is filled in a gap between the case groove 18 and the connector projection 30. That is, the electronic device 2 further includes the seal 38. The gap between the case groove 18 and the connector projection 30 is filled with the seal 38. Similarly, a gap between the case groove 18 and the case projection 24 is filled with the seal 38 and a gap between the connector groove 32 and the case projection 24 is filled with the seal 38. The gaps between the grooves and the projections are filled with the seal 38.

A structure, for the signal connector 8a, in which the connector 8 is joined to the upper case 12 and the lower case 10 has been described above. The structure is the same for the bus bar connector 8b and the capacitor connector 8c. The bus bar connector 8b and the capacitor connector 8c each have the connector projection 30 on the surface on the lower case 10 side. The bus bar connector 8b and the capacitor connector 8c each have the connector groove 32 on the surface on the upper case 12 side. The bus bar connector 8b and the capacitor connector 8c are each disposed between the lower case 10 and the upper case 12. At this time, the connector projection 30 of each of the bus bar connector 8b and the capacitor connector 8c is fitted into the case groove 18. The case projection 24 is fitted into the connector groove 32 of each of the bus bar connector 8b and the capacitor connector 8c.

Figure 8:
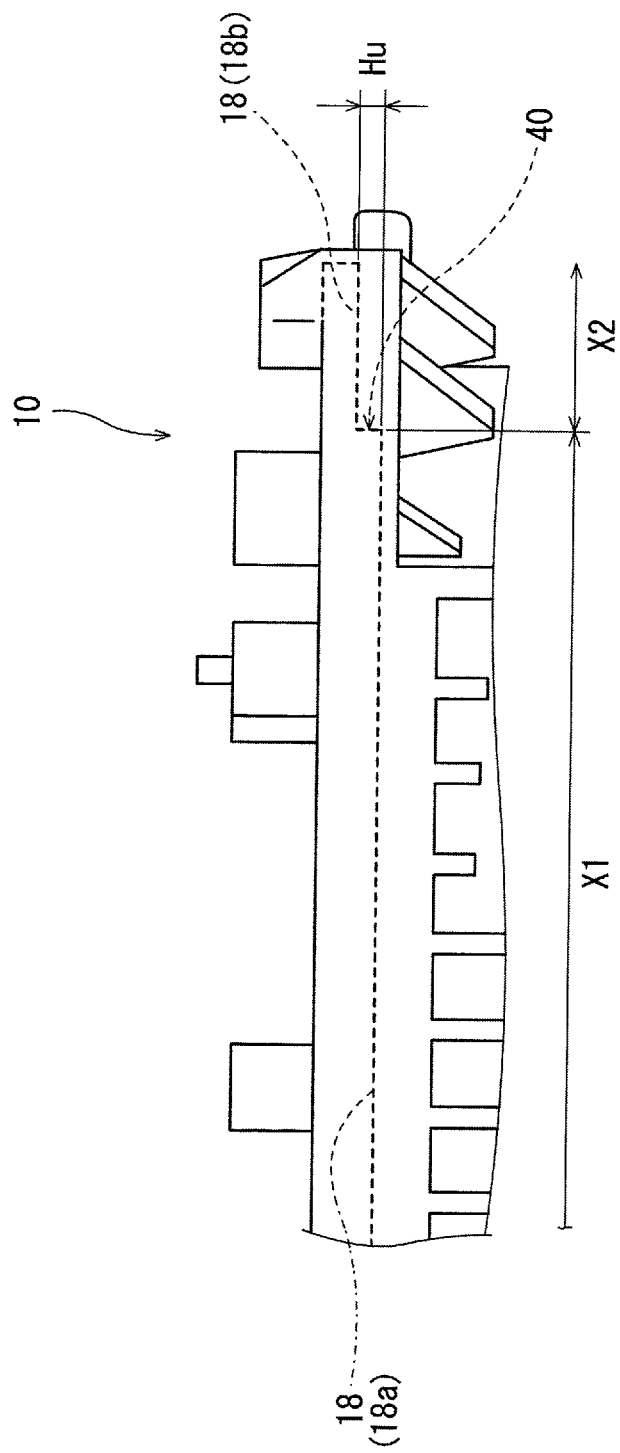
FIG. 8 is a side view of a part of the lower case shown in FIG. 2.

FIG. 8 is a side view showing, in an enlarged manner, the lower case 10 near a portion indicated by reference character A in FIG. 2. In FIG. 8, the bottom of the case groove 18 is indicated by a broken line. In FIG. 8, the connector projection 30 is fitted into the case groove 18 in a region indicated by reference character X1. This portion of the case groove 18 is called a connector fitting portion 18a. In a region indicated by reference character X2, the case projection 24 is fitted into the case groove 18. This portion of the case groove 18 is called a case fitting portion 18b. In the case groove 18, the depth of the connector fitting portion 18a is greater than the depth of the case fitting portion 18b. Thus, a stepped portion 40 is formed on the bottom of the case groove 18 at a boundary between the connector fitting portion 18a and the case fitting portion 18b.

In FIG. 5, a double-headed arrow H1 represents the height of the connector projection 30. In FIG. 4, a double-headed arrow H2 represents the height of the case projection 24. As described above, according to the depth of the connector fitting portion 18a being greater than the depth of the case fitting portion 18b, the height H1 is greater than the height H2.

The electronic device 2 is assembled in the following steps S1 to S5.

[Step S1]

A sealant having fluidity is caused to flow into the connector fitting portion 18a of the case groove 18. As described above, the connector fitting portion 18a is deeper than the case fitting portion 18b. The stepped portion 40 between the bottom of the connector fitting portion 18a and the bottom of the case fitting portion 18b prevents the sealant from flowing from the connector fitting portion 18a to the case fitting portion 18b. The stepped portion 40 disposed on the bottom of the case groove 18 serves as an obstructor for inhibiting the flow of the sealant.

[Step S2]

Figure 9:
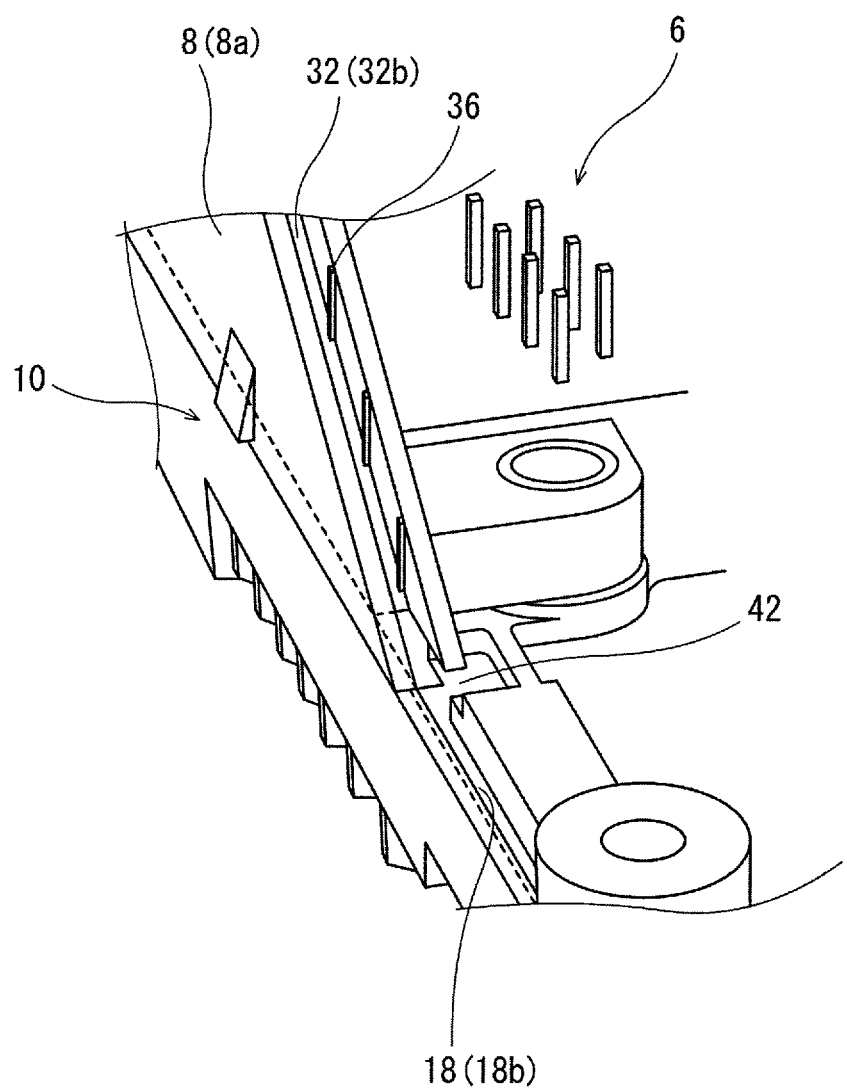
FIG. 9 is a perspective view showing a state where the connector is disposed on the lower case shown in FIG. 3.

As indicated by an arrow S2 in FIG. 2, the circuit substrate 6 with the connector 8 mounted thereto is disposed in the lower case 10, and the connector projection 30 is fitted into the connector fitting portion 18a of the case groove 18. FIG. 9 shows a state where the circuit substrate 6 is disposed in the lower case 10 in the portion, of the lower case 10, shown in FIG. 3. As shown in FIG. 9, in this state, the case fitting portion 18b and the connector groove 32 are joined to each other at the boundary between the case fitting portion 18b and the connector fitting portion 18a. A continuous groove is formed by the case fitting portion 18b of the case groove 18 and the connector groove 32.

[Step S3]

The sealant is caused to flow over the entirety of the case fitting portion 18b and the connector groove 32 which are joined to each other. As described above, the plurality of the groove projections 36 are disposed on the side wall 34 of the tilted portion 32b of the connector groove 32. The groove projections 36 inhibit the sealant from flowing from the tilted portion 32b. The groove projections 36 disposed on the side wall 34 of the connector groove 32 serve as an obstructor for inhibiting the flow of the sealant.

As shown in FIGS. 3 and 9, a portion, of the case groove 18, having an increased width is formed at the boundary between the case fitting portion 18b and the connector fitting portion 18a. This portion is called a liquid storage portion 42 of the case groove 18. When the sealant has flowed over the entirety of the case fitting portion 18b and the connector groove 32 which are joined to each other, the sealant also flows into the liquid storage portion 42.

[Step S4]

As indicated by an arrow S4 in FIG. 2, the lower case 10 is covered with the upper case 12. The connector 8 is disposed between the lower case 10 and the upper case 12. At the position at which the connector 8 is disposed therebetween, the case projection 24 is fitted into the connector groove 32. At the position at which the connector 8 is not disposed therebetween, the case projection 24 is fitted into the case groove 18.

[Step S5]

The lower case 10 and the upper case 12 are left as they are for a predetermined time in a state where the lower case 10 is covered with the upper case 12. The sealant is hardened over time. The sealant is hardened into the seal 38. Thus, assembling of the electronic device 2 ends.

The effects of the present invention will be described below.

In the electronic device 2 of the present invention, the connector groove 32 has the groove projections 36 on the side wall 34 thereof. The groove projections 36 serve as an obstructor for inhibiting the flow of the sealant. Since the groove projections 36 inhibit the flow of the sealant, the sealant is prevented from becoming insufficient in some portions of the connector groove 32. In the electronic device 2, high sealability is achieved.

The groove projections 36 are preferably disposed on the tilted portion 32b. In the tilted portion 32b, the sealant easily flows. In the tilted portion 32b, the sealant tends to become insufficient. By the groove projections 36 being disposed in the tilted portion 32b, the flow of the sealant is inhibited also in the tilted portion 32b. In the electronic device 2, high sealability is achieved.

In FIG. 6(A), a double-headed arrow W1 represents the width of the connector groove 32 at a position where the projection 36 is not disposed. The width W1 is measured in the direction perpendicular to the side wall 34. A double-headed arrow W2 represents the width of the connector groove 32 at a position where the projection 36 is disposed. In the present embodiment, the width W2 represents the distance, between the heads of the groove projections 36, which is measured in the direction perpendicular to the side wall 34. When the groove projections 36 are disposed on only one of the side walls 34, the width W2 represents the distance between the head of the projection 36 and a flat portion of the side wall 34 at which the projection 36 is not disposed, and the distance is measured in the direction perpendicular to the side wall 34.

A proportion (W2/W1) of the width W2 to the width W1 is preferably not greater than 95%. When the proportion (W2/W1) is not greater than 95%, the projection 36 effectively inhibits the flow of the sealant. In the electronic device 2, high sealability is achieved. The proportion (W2/W1) is preferably not less than 60%. When the proportion (W2/W1) is not less than 60%, the projection 36 is unlikely to obstruct distribution of the sealant over the entirety of the connector groove 32 when the sealant flows thereinto. Thus, the sealant can be distributed over the entirety of the connector groove 32. In the electronic device 2, high sealability is achieved.

In FIG. 6(B), a double-headed arrow Dg represents the distance, between the adjacent groove projections 36, which is measured in the direction in which the connector groove 32 extends. A double-headed arrow Wp represents the width, of the projection 36, which is measured in the direction in which the connector groove 32 extends. A proportion (Wp/Dg) of the width Wp to the distance Dg is preferably not less than 5%. When the proportion (Wp/Dg) is not less than 5%, the groove projections 36 effectively inhibit the flow of the sealant. In the electronic device 2, high sealability is achieved. The proportion (Wp/Dg) is preferably not greater than 25%. When the proportion (Wp/Dg) is not greater than 25%, the groove projections 36 are unlikely to obstruct distribution of the sealant over the entirety of the connector groove 32 when the sealant flows thereinto. Thus, the sealant can be distributed over the entirety of the connector groove 32. In the electronic device 2, high sealability is achieved.

The embodiment in which the groove projections 36 are disposed in the connector groove 32 has been described above. The groove projections 36 may be disposed in the case groove 18. In this case, the groove projections 36 may be aligned on only one of the side walls 34 of the case groove 18 or may be aligned on both of the side walls 34 thereof. When the groove projections 36 are aligned on both of the side walls 34, positions of the groove projections 36 aligned on one of the side walls 34 and positions of the groove projections 36 aligned on the other of the side walls 34 may be the same or may be shifted in the direction in which the case groove 18 extends. For example, the groove projections 36 on one of the side walls 34 of the case groove 18 and the groove projections 36 on the other of the side walls 34 thereof may be alternately aligned.

When the case groove 18 has the tilted portion 32b, the groove projections 36 are preferably disposed on the tilted portion 32b. When the case groove 18 has the groove projections 36, a preferable range of a proportion of the width of the case groove 18 at a position where the groove projections 36 are disposed, to the width of the case groove 18 at a position where the groove projections 36 are not disposed, is the same as the preferable range of the proportion (W2/W1). When the case groove 18 has the groove projections 36, a preferable range of a proportion of the width of the projection 36 to the distance between the adjacent groove projections 36 is the same as the preferable range of the proportion (Wp/Dg).

In the electronic device 2, the connector fitting portion 18a is deeper than the case fitting portion 18b. Thus, the stepped portion 40 is formed between the bottom of the connector fitting portion 18a and the bottom of the case fitting portion 18b. The stepped portion 40 serves as an obstructor for inhibiting the flow of the sealant. Thus, the sealant that has flowed into the connector fitting portion 18a is prevented from flowing into the case fitting portion 18b. The sealant is prevented from becoming insufficient in the connector fitting portion 18a. In the electronic device 2, high sealability is achieved.

In FIG. 8, a double-headed arrow Hu represents the height of the stepped portion 40. The height Hu is preferably not less than 2 mm. When the height Hu is not less than 2 mm, the stepped portion 40 effectively inhibits the flow of the sealant. In the electronic device 2, high sealability is achieved. The height Hu is preferably not greater than 10 mm. When the height Hu is not greater than 10 mm, the depth of the case groove 18 is not excessively great. In the device, an amount of the sealant to be required is reduced.

The embodiment in which the stepped portion 40 is disposed at the bottom of the case groove 18 has been described above. The stepped portion 40 may be disposed at the bottom of the connector groove 32. When the stepped portion 40 is disposed at the bottom of the connector groove 32, a preferable range of the height of the stepped portion 40 is the same as the preferable range of the height Hu.

The lower case 10, the upper case 12, and the connector 8 are disposed at a boundary portion between the case fitting portion 18b and the connector fitting portion 18a. At this portion, these three components are joined to each other. In this portion, the structure is more complicated than in other portions. Therefore, it is difficult to achieve high sealability.

In the electronic device 2, the liquid storage portion 42 of the case groove 18 is disposed at the boundary between the case fitting portion 18b and the connector fitting portion 18a. When the electronic device 2 is assembled, the sealant flows into the liquid storage portion 42. The sealant that has flowed into the liquid storage portion 42 effectively contributes to improvement of sealability at a portion at which the lower case 10, the upper case 12, and the connector 8 are joined to each other. In the electronic device 2, high sealability is achieved.

As described above, according to the present invention, the electronic device which allows achievement of high sealability is obtained. Thus, it is clear that the present invention is superior.

The electronic device described above is used for various devices and vehicles including automobiles.

The above descriptions are merely illustrative examples, and various modifications can be made without departing from the principles of the present invention.

What is claimed is:

1. An electronic device comprising:
   a box-shaped housing;
   a circuit substrate housed in the housing;
   a connector that is mounted to the circuit substrate and that has a portion exposed to outside of the housing; and
   a seal obtained by a sealant having fluidity being hardened,
   wherein the housing includes a lower case and an upper case that covers the lower case,
   wherein the connector is disposed between the upper case and the lower case,
   wherein the lower case has, in a surface on the upper case side of the lower case, a case groove that extends along a peripheral edge portion of the surface,
   wherein the upper case has, on a surface on the lower case side of the upper case, a case projection that extends along a peripheral edge portion of the surface,
   wherein the connector has a connector groove in a surface on the upper case side, and has a connector projection on a surface on the lower case side,
   wherein the connector projection is fitted into the case groove and the case projection is fitted into the connector groove at a position at which the connector is disposed between the upper case and the lower case,
   wherein the case projection is fitted into the case groove at a position at which the connector is not disposed between the upper case and the lower case,
   wherein the seal is filled in a gap between the case groove and each of the case projection and the connector projection, and in a gap between the connector groove and the case projection,
   wherein an obstructor for inhibiting flow of the sealant is disposed in the case groove or the connector groove,
   wherein each of the case groove and connector groove has an inner wall and an outer wall, a width between the inner wall and the outer wall, a depth and a length, and
   wherein the obstructor is a projection disposed on a side wall of the case groove or the connector groove, the obstructor having a height, a depth extending into the case groove or the connector groove, and a width that is less than a length of the case groove or the connector groove.

2. The electronic device according to claim 1, wherein the case groove or the connector groove has a tilted portion that is tilted relative to a horizontal direction, and
   the projection is disposed in the tilted portion.

3. The electronic device according to claim 1, wherein, in the case groove or the connector groove, a proportion of a width of the groove in a portion where the projection is disposed, to a width of the groove in a portion where the projection is not disposed, is not less than 60% and not greater than 95%.

4. The electronic device according to claim 1, wherein, in the case groove or the connector groove, a plurality of the projections are aligned in a direction in which the groove extends, and a proportion of a width of the projection to a distance between the projections is not less than 5% and not greater than 25%.

5. The electronic device according to claim 1, wherein the obstructor comprises a plurality of projections extending from the inner wall or the outer wall of the connector groove or case groove.

6. The electronic device according to claim 1, wherein, in the case groove or the connector groove, a plurality of the projections are aligned in a direction in which the groove extends, and
   wherein a width of each projection is less than a distance between the projections.

7. The electronic device according to claim 1, wherein an entirety of each projection of the plurality of the projections is disposed on a side wall of the case groove or the connector groove.

8. An electronic device comprising:
   a box-shaped housing;
   a circuit substrate housed in the housing;
   a connector that is mounted to the circuit substrate and that has a portion exposed to outside of the housing; and
   a seal obtained by a sealant having fluidity being hardened,
   wherein the housing includes a lower case and an upper case that covers the lower case,
   wherein the connector is disposed between the upper case and the lower case,
   wherein the lower case has, in a surface on the upper case side of the lower case, a case groove that extends along a peripheral edge portion of the surface,
   wherein the upper case has, on a surface on the lower case side of the upper case, a case projection that extends along a peripheral edge portion of the surface,
   wherein the connector has a connector groove in a surface on the upper case side, and has a connector projection on a surface on the lower case side,
   wherein the connector projection is fitted into the case groove and the case projection is fitted into the connector groove at a position at which the connector is disposed between the upper case and the lower case,
   wherein the case projection is fitted into the case groove at a position at which the connector is not disposed between the upper case and the lower case,
   wherein the seal is filled in a gap between the case groove and each of the case projection and the connector projection, and in a gap between the connector groove and the case projection, and wherein an obstructor for inhibiting flow of the sealant is disposed in the case groove or the connector groove, and wherein the obstructor is a stepped portion disposed at a bottom of the case groove or the connector groove.

9. The electronic device according to claim 8, wherein a depth of a portion, of the case groove, into which the connector projection is fitted is made greater than a depth of a portion, of the case groove, into which the case projection is fitted, to form the stepped portion.

10. The electronic device according to claim 8, wherein a height of the stepped portion is not less than 2 mm.

11. An electronic device comprising:
a box-shaped housing;
a circuit substrate housed in the housing;
a connector that is mounted to the circuit substrate and that has a portion exposed to outside of the housing; and
a seal obtained by a sealant having fluidity being hardened,
wherein the housing includes a lower case and an upper case that covers the lower case,
wherein the connector is disposed between the upper case and the lower case,
wherein the lower case has, in a surface on the upper case side of the lower case, a case groove that extends along a peripheral edge portion of the surface, the case groove having an inner wall and an outer wall,
wherein the upper case has, on a surface on the lower case side of the upper case, a case projection that extends along a peripheral edge portion of the surface,
wherein the connector has a connector groove in a surface on the upper case side, and has a connector projection on a surface on the lower case side,
wherein the connector projection is fitted into the case groove and the case projection is fitted into the connector groove at a position at which the connector is disposed between the upper case and the lower case,
wherein the case projection is fitted into the case groove at a position at which the connector is not disposed between the upper case and the lower case,
wherein the seal is filled in a gap between the case groove, and each of the case projection and the connector projection and in a gap between the connector groove and the case projection, and
a liquid storage portion in fluid communication with the case groove and extending from the inner wall of the case groove.

12. The electronic device according to claim 11, wherein the case groove has a first section receiving the case protection and a second section receiving the connector projection, and
wherein the liquid storage portion is at a boundary between the first section and second section.

* * * * *